US008813003B2

(12) United States Patent
Nayak et al.

(10) Patent No.: US 8,813,003 B2
(45) Date of Patent: *Aug. 19, 2014

(54) SYSTEM AND METHOD FOR INFERRING HIGHER LEVEL DESCRIPTIONS FROM RTL TOPOLOGY BASED ON NAMING SIMILARITIES AND DEPENDENCY

(71) Applicant: Atrenta, Inc., San Jose, CA (US)

(72) Inventors: Anshuman Nayak, San Jose, CA (US); Samantak Chakrabarti, West Bengal (IN); Brijesh Agrawal, Greater Noida (IN); Nitin Bhardwaj, Delhi (IN)

(73) Assignee: Atrenta, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/056,094

(22) Filed: Oct. 17, 2013

(65) Prior Publication Data

US 2014/0047399 A1  Feb. 13, 2014

Related U.S. Application Data

(63) Continuation of application No. 13/433,395, filed on Mar. 29, 2012, now Pat. No. 8,589,835.

(60) Provisional application No. 61/587,367, filed on Jan. 17, 2012.

(51) Int. Cl.
*G06F 17/50* (2006.01)
(52) U.S. Cl.
USPC ............................ 716/101; 716/100; 716/104
(58) Field of Classification Search
USPC .................................................. 716/100–107
See application file for complete search history.

(56) References Cited

U.S. PATENT DOCUMENTS

| | | | |
|---|---|---|---|
| 5,164,908 A * | 11/1992 | Igarashi | 716/124 |
| 6,219,821 B1 | 4/2001 | Hagerman et al. | |
| 6,295,636 B1 | 9/2001 | Dupenloup | |
| 6,980,975 B2 * | 12/2005 | Reed et al. | 706/47 |
| 7,694,241 B1 | 4/2010 | Jadcherla et al. | |
| 7,925,940 B2 | 4/2011 | Pandey et al. | |
| 8,079,013 B1 | 12/2011 | Ma et al. | |
| 8,589,835 B2 * | 11/2013 | Nayak et al. | 716/103 |
| 2008/0091981 A1 | 4/2008 | Dokken et al. | |
| 2009/0271750 A1 | 10/2009 | Richardson et al. | |
| 2010/0161303 A1 | 6/2010 | McGowan et al. | |
| 2010/0332172 A1 | 12/2010 | Kaufman et al. | |
| 2011/0185307 A1 | 7/2011 | Toyooka et al. | |
| 2011/0271241 A1 | 11/2011 | Krishnamoorthy et al. | |

* cited by examiner

*Primary Examiner* — Nghia Doan
(74) *Attorney, Agent, or Firm* — Sughrue Mion, PLLC

(57) ABSTRACT

A system and methods are disclosed for inferring higher level descriptions of circuit connectivity from register transfer level (RTL) netlists in order to provide more understandable and manageable design descriptions for complex System-on-Chip (SOC) designs. In particular, rule-based interface matching is automatically performed by analyzing actual port names on instances of functional elements and blocks to form signal groupings that comprise a higher-level abstracted description. An example syntax is provided for defining rules that are used to define how various analysis are performed. Data describing standard interfaces on common Intellectual Property (IP) blocks is optionally made available to facilitate interface matching. Also, a facility is included to allow user-guided mapping on instantiated interfaces with respect to actual port names in an RTL-level design.

17 Claims, 4 Drawing Sheets

SYSTEM AND METHOD FOR INFERRING HIGHER LEVEL DESCRIPTIONS FROM RTL TOPOLOGY BASED ON NAMING SIMILARITIES AND DEPENDENCY

CROSS-REFERENCE TO RELATED PATENT APPLICATIONS

This is a Continuation application of U.S. application Ser. No. 13/433,395 filed Mar. 29, 2012 which claims priority from U.S. Provisional Application No. 61/587,367 filed Jan. 17, 2012, the disclosures of which are incorporated herein in their entirety by reference.

BACKGROUND

1. Field

The present invention relates generally to Electronic Design Automation (EDA), and in particular to the processing of netlists for System-on-Chip (SOC) designs relative to signal naming, signal connectivity, and different levels of abstraction within an SOC description.

2. Description of the Related Art

System-On-Chip (SOC) designs are large and complex, frequently reaching sizes in excess of 50 million gates. As a result, when a new or enhanced application is to be addressed by a new design, the new design is most often a modification of a previous SOC design. Typically, an engineering organization attempts to use as much of the previous design as possible in order to save time, resources, and expense.

When attempting to reuse an existing SOC design, a common difficulty encountered by a design team is that the existing design may be poorly documented, or alternately simply exists only at a low register transfer level (RTL) description level with individual signal names which when viewed presents an overwhelming degree of complexity making it difficult to understand the design. Understanding the design is critical to modifying and reusing an existing design. Since creation of SOC designs typically require a team of many individuals, it is also common that at least some of the original designers are no longer available to explain an existing design—having either left the company or moved on to other projects.

Therefore, it would be useful to have an automated way to generate a higher-level description of an existing SOC design where in the higher-level description related signals are grouped together to create an abstracted description having a lower level of apparent complexity, and where a graphical representation of such a higher-level design will be much easier to understand and modify.

SUMMARY

According to an exemplary embodiment a method for automatically analyzing a circuit description netlist to produce a higher level description is provided. The method groups together signal names from s list of signal names according to similarities as defined by a list of rules.

Another exemplary embodiment provides a system for automatically analyzing an RTL-level circuit description netlist to produce a higher-level circuit description. The system includes one or more hardware processors and a memory that contains instructions for execution by the one or more hardware processors. The system groups together signal names according to similarities as defined by a list of rules.

BRIEF DESCRIPTION OF THE DRAWINGS

The foregoing and other objects, features, and advantages of one or more exemplary embodiments will be apparent from the following detailed description taken in conjunction with the accompanying drawings.

DETAILED DESCRIPTION

A system and methods are disclosed for inferring higher level descriptions of circuit connectivity from register transfer level (RTL) netlists in order to provide more understandable and manageable design descriptions for complex System-on-Chip (SOC) designs. In particular, rule-based interface matching is automatically performed by analyzing actual port names on instances of functional elements and blocks to form signal groupings that comprise a higher-level abstracted description. An example syntax is provided for defining rules that are used to define how various analysis are performed. Data describing standard interfaces on common Intellectual Property (IP) blocks is optionally made available to facilitate interface matching. Also, a facility is included to allow user-guided mapping on instantiated interfaces with respect to actual port names in an RTL-level design.

In the context of SoC design, an "IP Block" refers to a circuit block or macro function that may be connected to other such functions as the overall SoC design is built. These IP blocks are often purchased or licensed from other companies and therefore may contain some degree of Intellectual Property or IP. Many SoC designers refer to such blocks or macros simply as "IPs".

An interface is defined as a collection of logical names and their characteristics which are best defined together. Characteristics include signal attributes sometimes referred to as signal properties. By grouping signals according to rules that are consistent with certain high-level interfaces, an exemplary embodiment addresses the size and complexity of contemporary SOC designs. According to an exemplary embodiment, automatic grouping of signal names, where some association exists among names within a group, and associating a group of signal names with a particular interface, renders an SOC design in a simpler, higher level form, also referred to as a higher level of abstraction. This enables users to more easily understand the functionality of existing designs when the existing designs are reused in newer designs.

Figure 1:
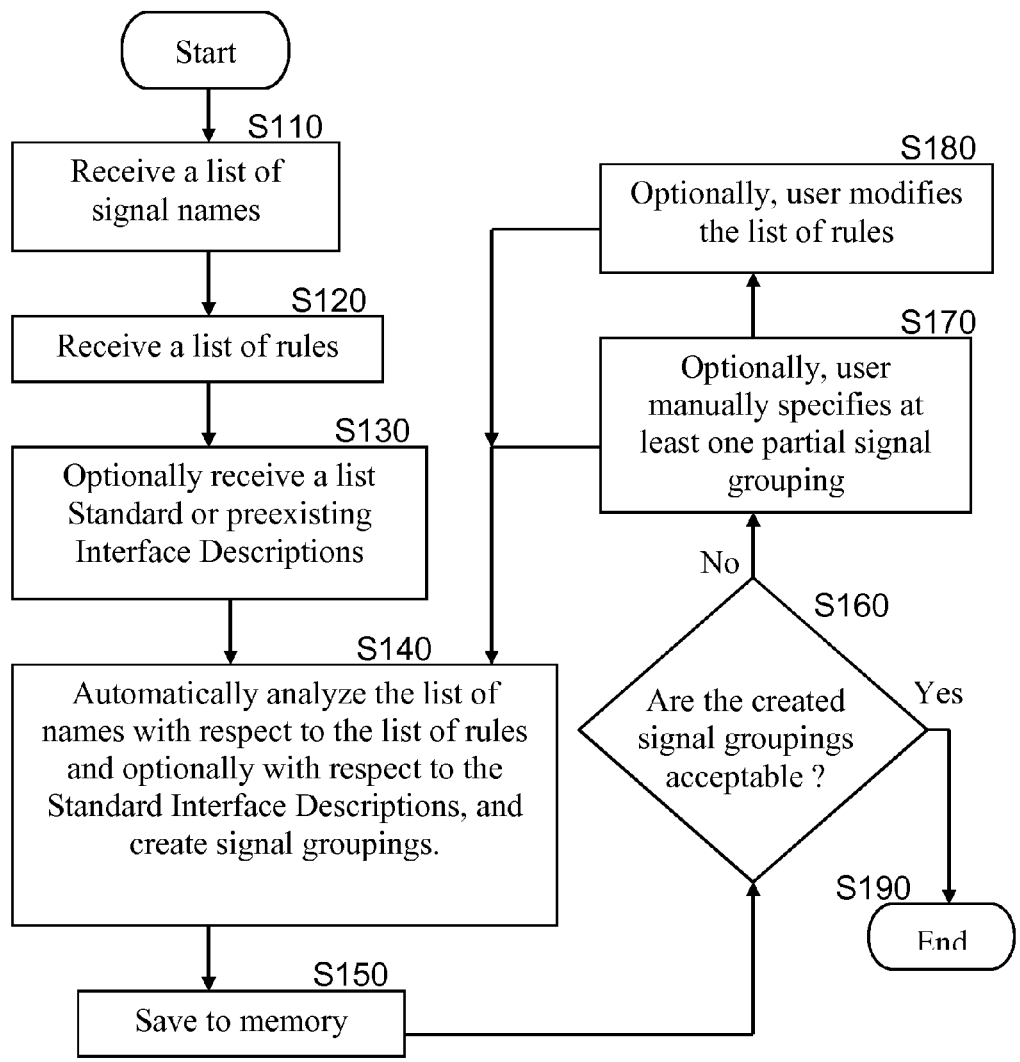
FIG. 1 shows an exemplary and non-limiting overview flowchart of a process where rule-based analysis is performed on a list of signal names to produce signal groupings that comprise a higher level description of a circuit.

FIG. 1 shows an exemplary and non-limiting flowchart 100 of a process where rule-based analysis is performed on a list of signal names to produce signal groupings that comprise a higher level description of a circuit. In S110 a list is received that contains signal names that represent at least a portion of an existing circuit description netlist. In S120 a list of rules is received which is used to process the list of signal names in order to determine signal groupings that represent in part a higher-level abstracted description of the netlist represented by the list of names. In optional S130 a list of standard interface descriptions describing common IP blocks that are used to facilitate interface matching and signal grouping is received. Also in S130, other forms of preexisting interface descriptions may be provided such as custom, user-defined interfaces.

In S140 analysis of the list of names with respect to the list of rules and optionally with respect to the standard or preexisting interface descriptions is performed. In accordance with the syntax of each rule in the list of rules, groupings of signals are automatically created. Each signal grouping is then represented by a single name and thus multiple signals are replaced in a higher-level abstracted description by a smaller number of names. This provides a simpler and more understandable overall description of the existing SOC design. In S150 the resultant signal groupings are saved in memory.

Choices for signal names in existing SOC designs are frequently inconsistent and/or poorly planned, and therefore the result of S140 may frequently not provide the most optimum result for signal groupings, especially on the first pass. Therefore a user may optionally make a determination in S160 as to whether the resultant signal groupings are acceptable in creating a more understandable and concise higher-level description. If the resultant signal groupings are deemed to be acceptable, the process may be considered complete at S190. If the resultant signal groupings are deemed to not yet be acceptable, a user may choose to iterate the analysis process according to revised rules or manually specified partial signal groupings, or both. While S160 is described with respect to a user input, automation may be used to determine if the groupings reached satisfy a predefined criteria and if not, the process continues in an attempt to reach a better degree of optimization. In S170 a user may optionally specify at least one partial signal grouping in order to guide the creation of groupings that the user feels make the most sense. Prior to returning to S140, the user may also optionally modify S180 the list of rules. In one exemplary embodiment, suggestions for modification of rules are provided for the user's consideration. If the user has chosen to manually specify in S170 at least one partial signal grouping, further analyses per S140 maintains any such manually specified partial signal groupings, keeping them intact even as further signal groupings are established per S140. In addition, the subsequent analyses per S140 may add signal names to partial signal groupings that have been previously manually specified.

Figure 2:
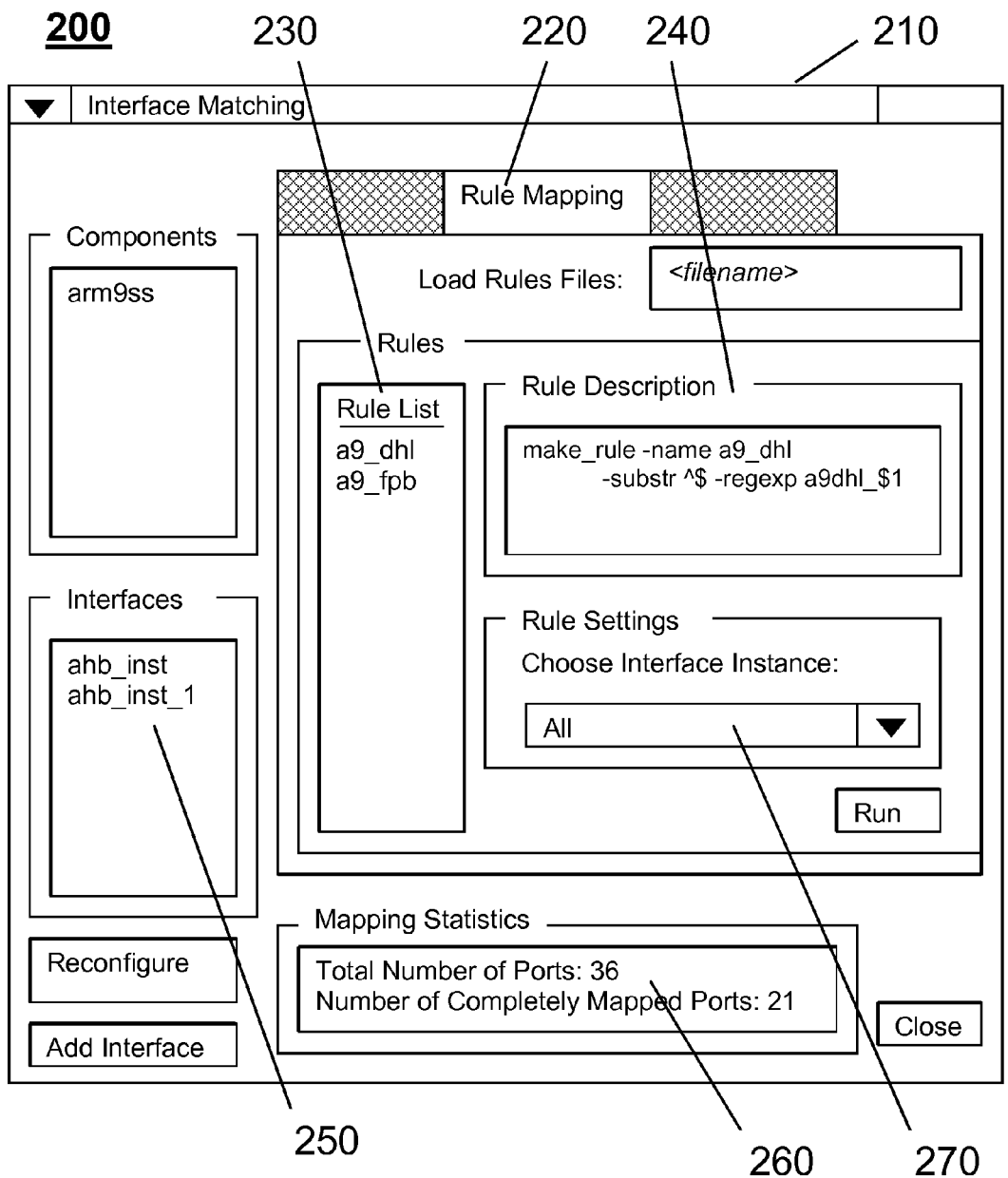
FIG. 2 shows an example of a user interface in which a user creates and modifies rules.

FIG. 2 shows an exemplary and non-limiting User Interface (UI) for controlling the analysis according to an exemplary embodiment with respect to rule-based analysis. In FIG. 2, the tab for controlling rule-based mapping is shown. A UI 200 for entering and modifying rules is not necessarily required for rule-based mapping. Rules are typically textual and can be created by other means. A UI 200 such as that shown in FIG. 2 makes the overall process much easier for the user.

A UI 200 supporting a number of aspects of the invention is shown in FIG. 2 with respect to user interface window 210. Specifically, the tab entitled "rule mapping" 220 is shown which includes a list of rules 230 by rule name and a description 240 showing the detailed rule for whatever rule is selected in the list 230. If a standard or preexisting interface has a relation to a specific rule, that interface is shown selected in interface list 250. To the extent that an analysis has already been run for a particular rule, corresponding mapping statistics are shown in window 260. The rule settings control 270 allows a user to choose interface instances upon which the rule will be applied.

Rule-Based Mapping

For rule-based interface matching, the invention matches physical ports in an RTL-level description to higher level logical interface descriptions. In other words, physical ports are grouped together into groups corresponding to logical interfaces. Interfaces could preexist and be provided by the user to define a logical grouping of ports already known to the user. Alternately an exemplary embodiment may use definitions of standard interfaces to guide the matching and grouping process. When preexisting or standard interface definitions are provided, the grouping of physical ports can be optimized to match a logical port grouping provided by the user. When preexisting or standard interface definitions are not provided, the signal names are grouped based on the supplied rules according to the rule syntax and also on other attributes that may be associated with some signal names.

According to an exemplary embodiment, a rule is a construct of some kind that indicates—according to the rule's syntax definition—how to process the list of names from the RTL level netlist in order to group names in a manner that the user feels is appropriate. There may be a default set of rules—with more wildcard operators included—or there may be rules that are specifically created by a user with regard to a specific SOC design or class of designs. Typically, a rule has some form of syntax that is interpreted in order to properly process the list of names.

In general, a rule typically looks to group together signal names by looking for common strings of characters that appear for example:

(i) at the beginning of a signal name:
ex: string1(31:0)
(ii) at the end of a signal name:
ex: abcdef_string2
(iii) anywhere in a signal name:
ex: abcdef_string3_pqrs
(iv) or, the rule may be looking for multiple common strings of characters that appear anywhere in a signal name:
ex: ghijk_string4_lmno_string5

Some examples of an exemplary and non-limiting syntax follow. A simple example is shown first where the user wishes the invention to group signals together among the following five signals:

abc_x1_sig1_pqr_i
abc_x1_sig2_pqr_i
abc_x1_sig3_pqr_i
abc_x1_sig4_pqr_i
abc_x1_sig5_pqr_i One rule enables the identification that abc_x1_ is the prefix and _pqr_i is the postfix expression of sig1, sig2, etc., and therefore these signals can be grouped together. The methods further identify that the names could be more than simple prefix/postfix and could have some attribute variations, as for example:

abc_x1_sig1_pqr_i// This is a input signal
abc_x1_sig2_pqr_o// this is an output signal
abc_x1_sig3_pqr_i// This is an input signal
abc_x1_sig4_pqr_o// This is an output signal
habc_x1_sig5_pqr_i// This is an input signal In this example, the i and o are appended to indicate attributes comprising an input and output signal respectively, so that the exemplary methodsa identify these attributes and group the signals accordingly.

However, in some places the grouping is not so obvious, for example:

abc_x1_sig1_pqr_iclk// This is a input signal
abc_x1_sig2_pqr_odft// this is an output signal
abc_x1_sig3_pqr_iret// This is an input signal abc_x1_sig4_pqr_oaddr// This is an output signal
abc_x1_sig5_pqr_idata// This is an input signal Sometimes a signal name has a higher level property attribute embedded in it. For example abc_x1_sig1_pqr_iclk has the last 3 characters clk attached since it is a clock pin. The other signals have dft, ret, addr, and data, all added because these are DFT pins, RESET pins ADDR pins and DATA pins. This information could be added as properties with the signal. To allow flexibility and extendibility, the exemplary methods and rule definitions provide a language to define such complex rules which can take in such properties attached to a signal (eg attributes like type CLOCK, RESET etc, directions input/output, range MSB, LSB etc etc) and create regular expressions around it. So, 2:$_foo is a regular expression which says the analysis takes the value of the property, then takes the 2 to last character of the property, appends a foo to it where foo is a character string representing a property as for example CLOCK, and the result is a substring which is added to the signal name.

So, for the example above, a user could define a rule to determine if a logical name, for instance CLOCK, and a physical name, for instance abc_x1_sig1_pqr_iclk, are related.

An example of such a rule follows, including a description of how the syntax is interpreted according to an exemplary embodiment in order to group together signals in the list of signal names:

make_rule substr (1:2) substr ($)-regexp lower(.*_i$1$2)

The substr keyword is used to create a splice of the logical name. Each substr creates a variable which is stored in $<number>. So, the first substr is stored in $1, the second substr is stored in $2, and so on.

In the above example, substr(1:2) indicates that the first two characters of the logical name should be assigned to $1. Characters A and $ are predefined characters which indicate the start and end of the string. Alternately, substr(1:2) could also have been written as substr(^:2)substr($) which indicates that the last character is stored in $2. Variable regexp defines a regular expression using the $<number>syntax. If this regular expression matches the physical port name, then there is a match. The concept of a regular expression is very standard in the software domain and is consistent with, for example, the Perl scripting language.

The example syntax has special keywords called to signify any character, and * to signify multiple of the characters. So for example .* will imply any character repeated multiple times. Also for example .*_$1$2 implies any character repeated multiple times provided it is completed by a _ character and the $1 characters are followed by the $2 characters.

Therefore in the original example for abc_x1_sig1_pqr_iclk, the .* will match to abc_x1_sig1_pqr, followed by the _i, followed by $1 which is c1, followed by $2 which is k. Hence CLOCK and abc_x1_sig1_pqr_iclk are synonymous as per this rule.

Similarly, the logical name RESET will lead to $1 as re, and $2 as t. So, abc_x1_sig1_pqr_iret will be processed by the rule as follows:

.* matches to abc_x1_sig1_pqr
followed by _i
followed by $1 which matches re
followed by $2 which matches t Hence, RESET and abc_x1_sig1_pqr_iret are synonymous per this rule. Since CLOCK and RESET form a logical group per a standard interface definition, hence abc_x1_sig1_pqr_iclk and abc_x1_sig1_pqr_iret also form part of a group.

User-Directed Mapping

Direct Mapping or User-Directed Mapping enables a user to make incremental changes to one or more signal groupings. A user can add more signals to a grouping or delete some signals from a grouping. Accordingly, any user-made changes to a grouping are maintained to ensure that any subsequent incremental changes use that grouping or partial grouping as a starting point. Subsequently, the results of the analysis and grouping process will improve incrementally, adding signal names to improve a grouping based on the starting point supplied by the user. Alternately, more groups based on the changed rules may be created.

Figure 3:
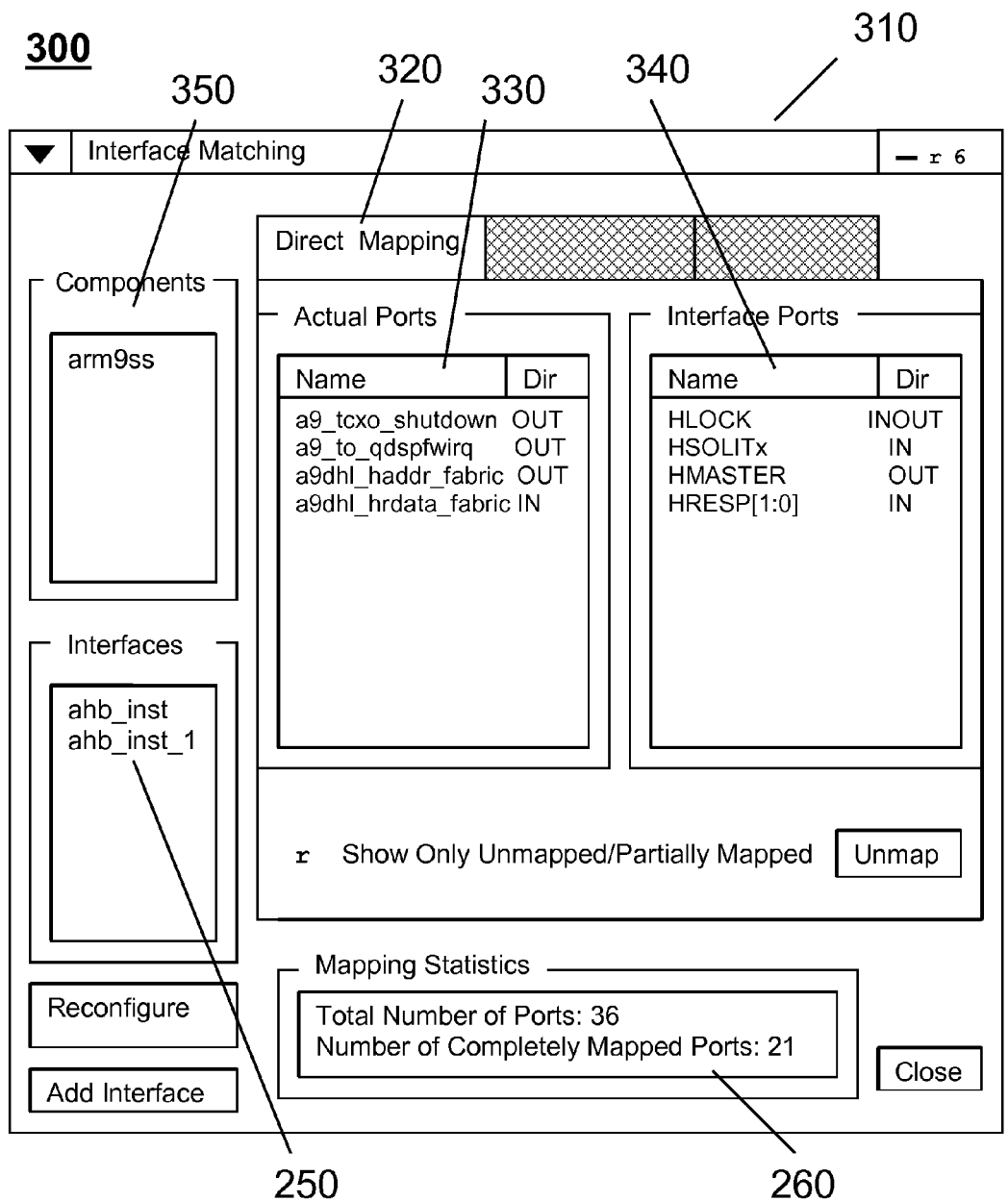
FIG. 3 shows an example of a user interface in which a user manually assigns signal names to form at least partial groups of signal names.

FIG. 3 shows an exemplary and non-limiting User Interface (UI) for controlling operation with respect to user-directed mapping. As shown in FIG. 2, the tab for direct mapping is shown. User interface window 310 is shown with the Direct Mapping tab 320 selected. The direct mapping tab provides a list of actual ports 330 in the RTL level netlist as well as a list 340 of logical interface ports which the software will eventually associate with groups of signal names from list 330. Using the interface of window 310, the user may associate specific port names 330 with an interface name 340 to create a partial grouping of signal names. As previously shown in FIG. 2, a list of standard or preexisting interfaces 250 is shown as well as mapping statistics 260.

Standard Interfaces and Custom Interfaces

Per step 130 of FIG. 1, a list of standard interfaces may be optionally provided for the grouping of signals per S140. Overall, an exemplary embodiment groups signal names representing physical ports together into groups corresponding to higher-level (abstracted) interfaces. Such higher-level interfaces can preexist in the form of a list of standard interfaces per S130, or alternately be provided by the user to define a logical grouping of ports. When operating per S140, a list of names corresponding to physical ports is analyzed to match a logical port name provided by the user. If a preexisting interface is not provided, the grouping of signals may be based on other properties. In general a definition for a particular standard or preexisting interface will include a list of logical names plus optionally attributes such as indicating the direction of a logical name in a master or slave instantiation of an interface, should that interface include a master/slave functionality.

A preexisting interface may be user-provided or alternately may be a standard interface such that a library of standard interfaces from companies like ARM Ltd. and Sonics, Inc. are frequently provided, which in turn allow identification of the respective IP with no initial user intervention.

When a standard interface is provided such as an ARM interface, the logical signal names in the ARM interface may assist the analysis by providing specific character strings to look for in addition to the software's basic task of looking for common strings as directed by the rules. In this particular case, the ARM interface consists of the following logical names: HCLK, HRESETn, HADDR, HTRANS, HWRITE, etc. In the rules, a user might still want to have portions of this logical name in the actual name and that will form the grouping. For example, the rule . . .

make_rule substr (^:$-2) substr ($)-regexp lower($1$2)
name R1

. . . will process a list of signals in light of the ARM interface definition in the following manner:

HCLK:$1 will be substr(^:$-2) which will be HC
$2 will be substr ($) which will be K. Expression will then be hck
HRESETn $1 will be substr(^:$-2) which will be HRESE $2 will be substr ($) which will be n. Expression will then be hresen HADDR $1 will be substr(^:$-2) which will be HAD $2 will be substr ($) which will be R. Expression will then be hadr The signals could be named:
sig1_hck_i
sig2_hresen_i
sig3_hadr_o These signals may also be grouped together according to the following rule . . .

make_rule substr (^:$-2) substr ($)-regexp {.*_lower ($1$2)_$dir} name R1

. . . which is followed in the following manner:

The initial .* implies any character until the analysis reaches _ followed by lower($1$2) as described earlier followed by the direction i or o based on whether the signal is an input or output.

In general, a standard or preexisting interface definition may include for each logical port one or more of the following attributes which represent a non-limiting, exemplary list: LogicalPortName; Direction; MSB; LSB; sig_type; default; registered; optional; and requiresDriver.

As described herein, a user can create some complex groupings based on interface names. In addition to the standard interfaces that may be supplied, such as but not limited to the ARM interface, a user can create more custom interfaces with custom names per a predetermined convention to allow the grouping of signals based on their interfaces and naming conventions.

EDA System and Software

Figure 4:
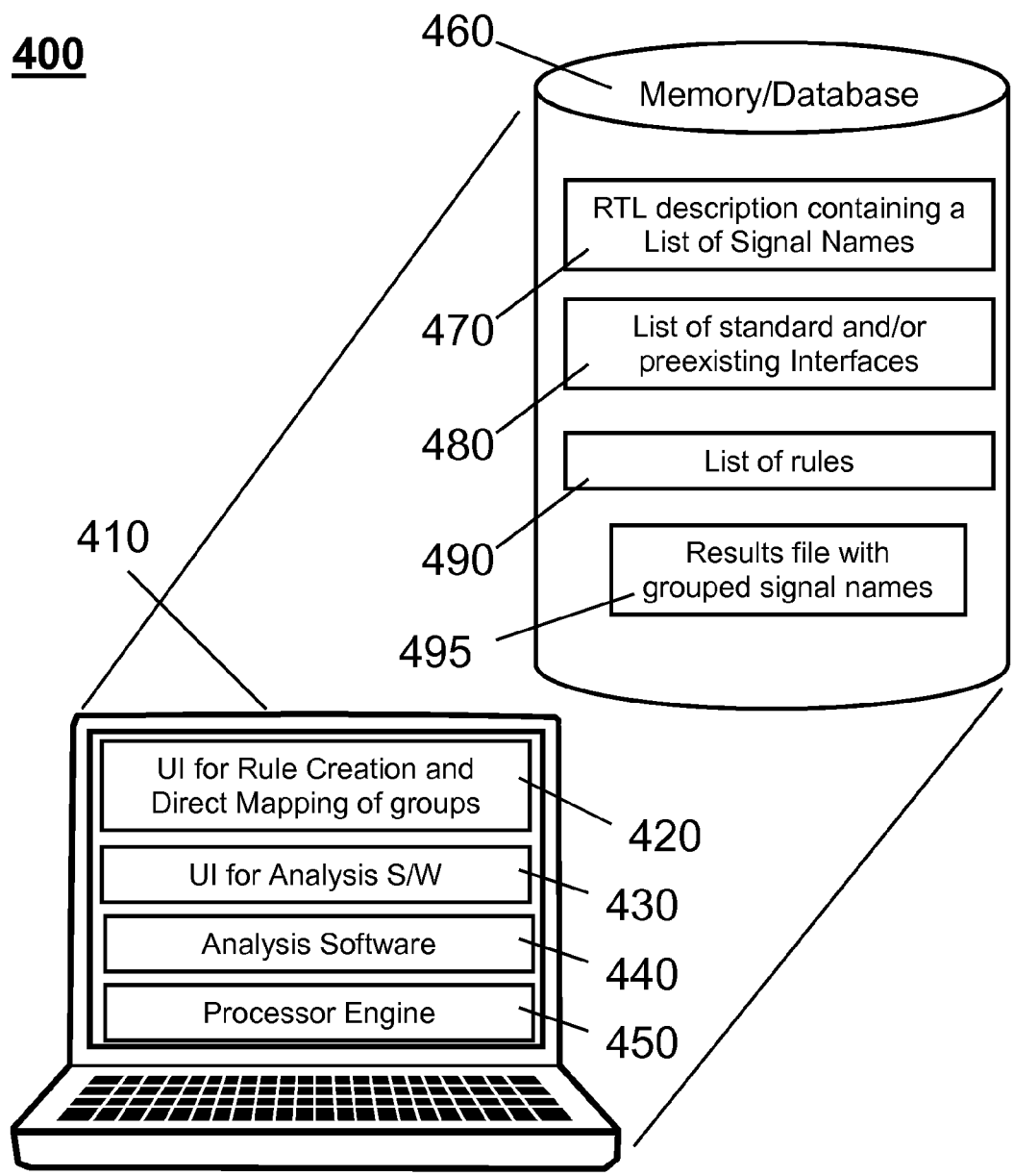
FIG. 4 shows a block diagram for an exemplary system.

According to an exemplary embodiment, the operations discussed above may be implemented on a computer platform 410 of some kind. Such a platform may include a dedicated workstation, a central computer operated from a remote terminal, or one or more computing resources located on the Internet including resources of the type now known as the "Cloud", and the likes. An exemplary and non-limiting embodiment of a dedicated computer aided design (CAD) or EDA system 400 is shown in FIG. 4. Here, a workstation 410 operates a UI 420 for providing rule creation and direct mapping of groups, UI 430 for operating an analysis software 440 operative according to the exemplary embodiments discussed above. Analysis software 440, contains a series of instructions that when executed on the workstation 410 allows for analyzing and grouping names from the list of names, and a processor hardware engine 450 upon which software for workstation 410 operates.

A memory and database resource 460 for workstation 410 is also shown in FIG. 4. The memory and database resource 460 may be located physically within the workstation 410 or alternately external to the workstation 410. Memory and database resource 460 may include an RTL description 470 containing a list of signal names which a user may wish to group, a list of standard and/or preexisting interfaces 480, a list of rules 490, and a results file 495 containing signal names which have been grouped according to the various exemplary embodiments discussed earlier.

The foregoing detailed description has set forth a few of the many forms that an exemplary embodiment can take. It is intended that the foregoing detailed description be understood as an illustration of selective exemplary embodiments of the invention and not as a limitation to the definition of the invention. It is only the claims, including all equivalents that are intended to define the scope of this invention.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer special purpose computer or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium or more specifically a computer readable storage medium that can direct a computer, or other programmable data processing apparatus, or other devices to function in a particular manner, such that the instructions stored in the computer readable medium produce an article of manufacture including instructions which implement the function/act specified in the flowchart and/or block diagram block or blocks.

Furthermore, certain principles discussed with reference to FIGS. 1-3 can be implemented as hardware, firmware, software or any combination thereof. Moreover, the software is preferably implemented as an application program tangibly embodied on a program storage unit, a non-transitory user machine readable medium, or a non-transitory machine-readable storage medium that can be in a form of a digital circuit, an analogy circuit, a magnetic medium, or combination thereof. The application program may be uploaded to, and executed by, a machine comprising any suitable architecture. Preferably, the machine is implemented on a user machine platform having hardware such as one or more central processing units ("CPUs"), a memory, and input/output interfaces. The user machine platform may also include an operating system and microinstruction code. The various processes and functions described herein may be either part of the microinstruction code or part of the application program, or any combination thereof, which may be executed by a CPU, whether or not such user machine or processor is explicitly shown. In addition, various other peripheral units may be connected to the user machine platform such as an additional data storage unit and a printing unit.

What is claimed is:

1. A computerized method for analyzing a circuit description netlist to produce a higher level description, wherein one or more processors perform the method comprising:

automatically analyzing a list of signal names that comprise at least a portion of the circuit description netlist according to a list of rules;

automatically grouping together signal names from the list of signal names according to similarities as defined by the list of rules, to produce groups of similar signal names;

for at least one group of signal names, identifying or creating a higher level interface definition consistent with signal names in the at least one group of signal names;

automatically assigning said at least one group of signal names to a higher-level interface definition; and automatically saving the grouped signal names in memory to produce the higher level description of the circuit description netlist based on the higher-level interface definition;

wherein automatically analyzing the list of signal names according to the list of rules comprises searching for one or more character substrings within a signal name according to a syntax encompassed within a rule from among said list of rules;

wherein at least one signal grouping is represented by a single name in the higher-level description whereby multiple signal names in the circuit description netlist are replaced by a smaller number of names in the higher-level description; and wherein at least one rule refers to one or more characteristic substring constructs that are consistent with a standard or preexisting interface definition.

2. The method of claim 1, further comprising:

wherein automatically analyzing the list of signal names according to the list of rules also includes analyzing the list of signal names with respect to a list of standard interface descriptions.

3. The method of claim 1, further comprising:

receiving an indication from a user regarding acceptability of the grouping of the signal names based on a result of the analyzing; and if the grouped signal names are not yet acceptable, automatically analyzing the list of signal names one more time according to a modified list of rules generated subsequent to receiving the indication from the user.

4. The method of claim 1, further comprising:

receiving an indication from a user regarding the acceptability of the grouping of the signal names based on a result of the analyzing; and if the grouped signal names are not yet acceptable, receiving a manual specification from the user for at least one partial grouping of signal names; and automatically analyzing the list of signal names at least one more time according to the list of rules while keeping the at least one manually specified partial grouping of signal names intact based on the received manual specification from the user.

5. The method of claim 4, wherein automatically analyzing the list of signal names at least one more time according to the list of rules while keeping the manually specified grouping of signal names intact includes adding signal names to at least one manually specified partial grouping of signal names while not altering any manual grouping that was previously specified.

6. The method of claim 1, wherein the at least one rule that refers to one or more characteristic substring constructs consistent with a standard or preexisting interface definition includes matching a substring of an interface to a physical signal name for the purpose of creating a grouping, including matching at least one signal attribute from the list of: signal type; signal direction; and interface name.

7. The method of claim 1, wherein a user interface functionality is provided to facilitate the definition of rules in said list of rules by a user.

8. The method of claim 4, wherein a user interface functionality is provided to facilitate the manually specifying of at least one partial grouping of signal names by a user.

9. A system for analyzing an RTL-level circuit description netlist to produce a higher-level circuit description, the system comprising:

one or more hardware processors;

a memory that contains instructions for execution by the one or more hardware processors; and a database for storing the RTL-level circuit description netlist and the higher-level circuit description, wherein the one or more hardware processors are configured to:

automatically analyze a list of signal names that comprise at least a portion of the RTL-level circuit description netlist according to a list of rules;

automatically group together signal names according to similarities as defined by the list of rules, to produce groups of similar signal names;

for at least one group of signal names, automatically identify or create a higher level interface definition consistent with signal names in said at least one group of signal names;

automatically assign said at least one group of signal names to a higher-level interface definition; and automatically save the grouped signal names in the database to produce the higher level description of the circuit description netlist based on the higher-level interface definition;

wherein the one or more hardware processors are further configured to automatically analyze the list of signal names according to the list of rules including searching for one or more character substrings within a signal name according to a syntax encompassed within a rule from among said list of rules;

wherein at least one signal grouping is represented by a single name in the higher-level description whereby multiple signal names in the circuit description netlist are replaced by a smaller number of names in the higher-level description; and wherein at least one rule refers to one or more characteristic substring constructs that are consistent with a standard or preexisting interface definition.

10. The system of claim 9, wherein:

the one or more hardware processors are further configured to automatically analyze the list of signal names according to the list of rules including analyzing the list of signal names with respect to a list of standard interface descriptions.

11. The system of claim 9, wherein:

the one or more hardware processors are further configured to:

receive an indication from a user that a grouping of signal names are not yet acceptable based on a result of the analyzing; and if the grouped signal names are not yet acceptable, analyze the list of signal names one more time according to a modified list of rules generated subsequent to receiving the indication from the user.

12. The system of claim 9, wherein:

the one or more hardware processors are further configured to:

receive an indication from a user that a grouping of signal names are not yet acceptable based on a result of the analyzing;

receive at least one manually specified partial grouping of signal names from a user; and automatically analyze the list of signal names at least one more time according to the list of rules while keeping the at least one manually specified partial grouping of signal names intact based on the received manual specification from the user.

13. The system of claim 12, wherein: the one or more hardware processors are further configured to automatically add signal names to at least one manually specified partial grouping of signal names while not altering any manual grouping that was previously specified.

14. The system of claim 9, wherein the at least one rule that refers to one or more characteristic substring constructs consistent with a standard or preexisting interface definition includes matching a substring of an interface to a physical signal name for the purpose of creating a grouping, including matching at least one signal attribute from the list of: signal type; signal direction; and interface name.

15. The system of claim 9, wherein one or more hardware processors are further configured to provide a user interface functionality to facilitate the definition of rules in said list of rules by a user.

16. The system of claim 12, wherein one or more hardware processors are further configured to provide a user interface functionality to facilitate the manual specification of at least one partial grouping of signal names by a user.

17. A non-transitory computer-readable storage medium storing instructions for enabling a computer to implement the method for analyzing a circuit description netlist to produce a higher level description, the method comprising:

automatically analyzing a list of signal names that comprise at least a portion of the circuit description netlist according to a list of rules;

automatically grouping together signal names from the list of signal names according to similarities as defined by the list of rules, to produce groups of similar signal names;

for at least one group of signal names, identifying or creating a higher level interface definition consistent with signal names in the at least one group of signal names;

automatically assigning said at least one group of signal names to a higher-level interface definition; and automatically saving the grouped signal names in memory to produce the higher level description of the circuit description netlist based on the higher-level interface definition;

wherein automatically analyzing the list of signal names according to the list of rules comprises searching for one or more character substrings within a signal name according to a syntax encompassed within a rule from among said list of rules;

wherein at least one signal grouping is represented by a single name in the higher-level description whereby multiple signal names in the circuit description netlist are replaced by a smaller number of names in the higher-level description; and wherein at least one rule refers to one or more characteristic substring constructs that are consistent with a standard or preexisting interface definition.

* * * * *